(12) United States Patent
Matsumura (10) Patent No.: US 8,963,592 B2
(45) Date of Patent: Feb. 24, 2015

(54) PLL CIRCUIT AND PHASE COMPARISON METHOD IN PLL CIRCUIT

(71) Applicant: Fujitsu Limited, Kawasaki (JP)

(72) Inventor: Hiroshi Matsumura, Isehara (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/196,149

(22) Filed: Mar. 4, 2014

(65) Prior Publication Data

US 2014/0285238 A1    Sep. 25, 2014

(30) Foreign Application Priority Data

Mar. 21, 2013 (JP) .................. 2013-059109

(51) Int. Cl.
*H03L 7/097* (2006.01)
*H03K 5/26* (2006.01)
*H03L 7/18* (2006.01)

(52) U.S. Cl.
CPC *H03L 7/097* (2013.01); *H03K 5/26* (2013.01); *H03L 7/18* (2013.01)
USPC .......................................... 327/147; 327/156

(58) Field of Classification Search
CPC .................................. H03L 7/087; H03L 7/18
USPC ............. 327/9, 147, 149, 153, 155, 156, 158, 327/161, 162, 163
See application file for complete search history.

(56) References Cited

U.S. PATENT DOCUMENTS

| 4,888,564 A | 12/1989 | Ishigaki | |
|---|---|---|---|
| 5,321,369 A | 6/1994 | Wolaver | |
| 2007/0001723 A1* | 1/2007 | Lin | 327/156 |
| 2008/0036513 A1* | 2/2008 | Koyama et al. | 327/156 |

FOREIGN PATENT DOCUMENTS

JP    H03-58546    3/1991

OTHER PUBLICATIONS

K. Tsutsumi, et al.; "A Low Noise Multi-PFD PLL with Timing Shift Circuit;" Microwave Symposium Digest (MTT), 2012 IEEE MTT-S International; pp. 1-3 (3 Sheets)/p. 3-4 of specification.
Extended European Search Report dated Jun. 17, 2014 in the corresponding European patent application No. 14157007.7.
Razavi, Behzad, "Heterodyne Phase Locking: A Technique for High-Speed Frequency Division," IEEE Journal of Solid-State Circuits, vol. 42, No. 12 (2007), pp. 2887-2892.

* cited by examiner

*Primary Examiner* — Jung Kim
(74) *Attorney, Agent, or Firm* — Kratz, Quintos & Hanson, LLP (57) ABSTRACT

A PLL circuit includes a divider configured to generate a divided signal having a cycle of T/M (where M is an integer greater than or equal to two) by dividing an oscillation signal; a phase comparator configured to generate a phase comparison result by calculating an exclusive logical OR of M reference signals and the divided signal, the M reference signals having the cycle of T and respective time intervals shifted sequentially by T/2M; a loop filter configured to generate a voltage signal using the phase comparison result as input; and a voltage-controlled oscillator configured to generate the oscillation signal by oscillating at a frequency depending on the voltage signal.

5 Claims, 7 Drawing Sheets

PLL CIRCUIT AND PHASE COMPARISON METHOD IN PLL CIRCUIT

CROSS-REFERENCE TO RELATED APPLICATIONS

This application is based upon and claims the benefit of priority of the prior Japanese Priority Application No. 2013-059109 filed on Mar. 21, 2013, the entire contents of which are hereby incorporated by reference.

FIELD

The disclosures herein generally relate to a PLL circuit and a phase comparison method in a PLL circuit.

BACKGROUND

A phase noise characteristic of a signal generated in a PLL (Phase-Locked Loop) circuit is used as an indicator that represents purity of the signal. Phase noise of a PLL circuit is an important performance indicator because the phase noise is a characteristic that influences performance of a wireless device.

A PLL circuit includes, in general, a phase comparator, a loop filter, a VCO (voltage-controlled oscillator), and a divider. The divider divides an oscillation signal output from the VCO by N to generate a divided signal. The phase comparator compares a phase of a reference signal from a reference oscillator with a phase of the divided signal, and outputs a signal that indicates a phase comparison result. The loop filter calculates an integral of the signal that indicates the phase comparison result, and supplies a voltage signal to the VCO at a voltage level that depends on the integral result. The VCO oscillates at a frequency depending on the voltage signal. While the VCO oscillates depending on the voltage signal generated by the loop filter, if a frequency difference between the reference signal and the divided signal is zero, the voltage signal converges to a certain voltage, and the PLL circuit transitions to a locked state.

Figure 1:
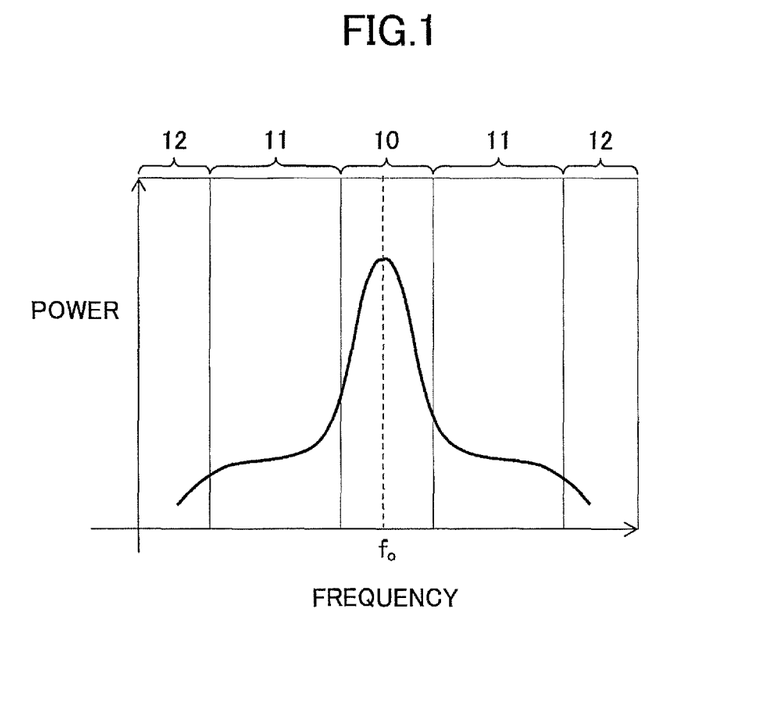
FIG. 1 is a schematic view illustrating a typical phase noise characteristic in a PLL circuit.

FIG. 1 is a schematic view illustrating a typical phase noise characteristic in a PLL circuit. The horizontal axis represents frequency, and the vertical axis represents phase noise power. $f_0$ is an oscillation frequency of the PLL circuit. Phase noise of the PLL can be classified into phase noise in region 10, phase noise in region 11, and phase noise in region 12. In the phase noise in region 10, phase noise at the reference oscillator is dominant. In the phase noise in region 11, phase noise at the phase comparator is dominant. In the phase noise in region 12, phase noise at the VCO is dominant. Note that the phase noise is generated with major causes such as thermal noise of a resistor, a fluctuation of a current flowing through an active element, and the like.

Among the above phase noise, the phase noise in region 11 has a greater influence on performance of a wireless device. This phase noise in region 11, or $S_{PLL}$, can be represented by the following formula in theory.

$$S_{PLL} \approx S_{PD}/K_d^2 \cdot N^2 \quad (1)$$

where $S_{PD}$ represents output noise of the phase comparator, $K_d$ represents gain of the phase comparator, and N represents a division ratio of the divider. As above, three major factors determines the phase noise in region 11. It can be understood from the above formula (1) that the phase noise of region 11 can be reduced by making the division ratio N smaller.

In a general PLL circuit, a reference signal and a divided signal are set to the same frequency. In contrast to that, to reduce the phase noise of region 11 by making the division ratio N smaller, there is a technology in which multiple or M phase comparators are arrayed to reduce the division ratio N to 1/M (see, for example, Non-Patent Document 1). In this technology, M reference signals are generated based on a reference signal having a cycle T so that the generated M reference signals have a cycle T and respective time intervals shifted sequentially by T/M. Each of these M phase comparators performs phase comparison between an edge of each of these M reference signals and a corresponding edge of the divided signal having a cycle T/M. As a result, outputs of the multiple M phase comparators are obtained at timings that are shifted sequentially by T/M. Then, by superposing these outputs by a SUM circuit, a phase comparison result is obtained that has a cycle T/M. This makes it possible to generate an oscillation signal having a frequency that is N times greater than the reference signal while the division ratio is set to N/M and the phase noise is reduced by $1/M^2$ times less.

However, this technology has the following problems: the circuit area and the power consumption of the delay circuit are great; and the circuit area and the power consumption of the SUM circuit are also great.

RELATED-ART DOCUMENTS

Patent Documents

[Patent Document 1] Japanese Laid-open Patent Publication No. 3-58546

Non-Patent Document

[Non-Patent Document 1] Tsutsumi, Koji, Takahashi, Yoshinori, Komaki, Masahiko, Taniguchi, Eiji, Shimozawa, Mitsuhiro, "A low noise multi-PFD PLL with timing shift circuit", Microwave Symposium Digest (MTT), 2012 IEEE MTT-S International, On page(s): 1-3

SUMMARY

According to at least one embodiment of the present invention, a PLL circuit includes a divider configured to generate a divided signal having a cycle of T/M (where M is an integer greater than or equal to two) by dividing an oscillation signal; a phase comparator configured to generate a phase comparison result by calculating an exclusive logical OR of M reference signals and the divided signal, the M reference signals having the cycle of T and respective time intervals shifted sequentially by T/2M; a loop filter configured to generate a voltage signal using the phase comparison result as input; and a voltage-controlled oscillator configured to generate the oscillation signal by oscillating at a frequency depending on the voltage signal.

The object and advantages of the embodiment will be realized and attained by means of the elements and combinations particularly pointed out in the claims. It is to be understood that both the foregoing general description and the following detailed description are exemplary and explanatory and are not restrictive of the invention as claimed.

DESCRIPTION OF EMBODIMENTS

In the following, embodiments of the present invention will be described with reference to the accompanying drawings.

Figure 2:
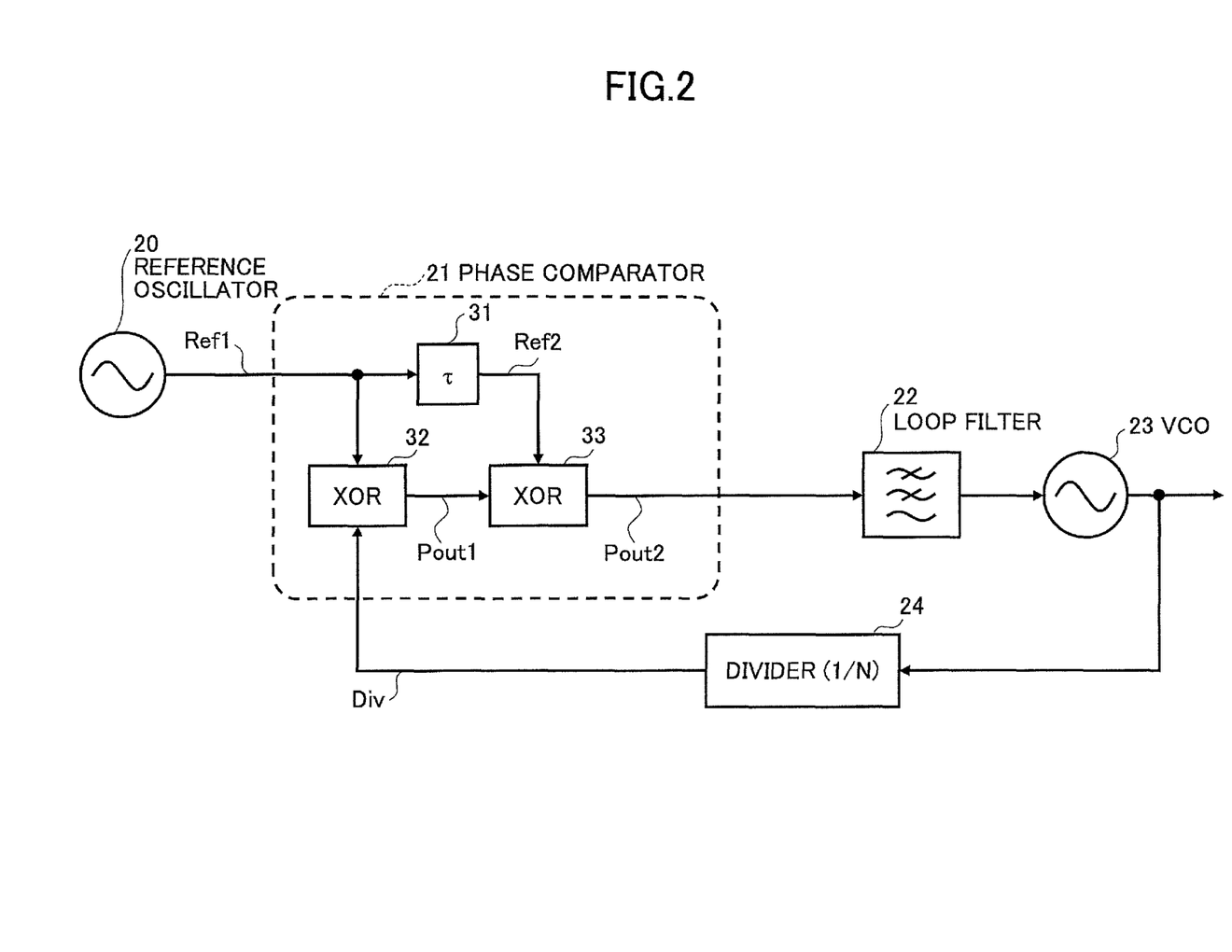
FIG. 2 is a schematic view illustrating an example of a configuration of a PLL circuit according to an embodiment.

FIG. 2 is a schematic view illustrating an example of a configuration of a PLL circuit according to an embodiment. The PLL circuit illustrated in FIG. 2 includes a reference oscillator 20, a phase comparator 21, a loop filter 22, a VCO 23, and a divider 24. Note that in FIG. 2 and in similar figures below, a boundary between a box of a functional block and other functional blocks basically designates a functional boundary, which may not necessarily correspond to a physical location boundary, an electrical signal boundary, a control logic boundary, or the like. Each of the circuits or functional blocks may be a hardware module physically separated from the other blocks to a certain extent, or a function in a hardware module that includes functions of other blocks.

The divider 24 divides an oscillation signal output from the VCO 23 by N to generate a divided signal Div. The phase comparator 21 compares a phase of a reference signal Ref1 from the reference oscillator 20 with a phase of the divided signal Div, to output a signal Pout2 that indicates a phase comparison result (a signal reflecting, for example, a phase difference). The loop filter 22 calculates an integral of the signal Pout2 that indicates the phase comparison result, and supplies a voltage signal to the VCO 23 at a voltage level that depends on the integral result. The VCO 23 oscillates at a frequency depending on the voltage signal from the loop filter 22. While the VCO 23 oscillates depending on the voltage signal generated by the loop filter 22, if a frequency difference between the reference signal Ref1 and the divided signal Div is zero, the voltage signal converges to a certain voltage, and the PLL circuit transitions to a locked state.

As will be described in detail later, the divider 24 divides the oscillation signal from the VCO 23 to generate the divided signal Div having the cycle of T/M. Here, M is an integer greater than or equal to two, which is two in this example. Also, T is the cycle of the reference signal Ref1 that is oscillated by the reference oscillator 20. The phase comparator 21 calculates an exclusive logical OR of the reference signals Ref1-Ref2 and the divided signal Div to generate a phase comparison result Pout2 where the M (two in this example) reference signals Ref1-Ref2 have the cycle T and respective time intervals shifted by sequentially T/2M (T/4 in this example). As described above, the loop filter 22 receives the phase comparison result as input to generate the voltage signal. Further, the VCO 23 oscillates at a frequency depending on the voltage signal to generate an oscillation signal.

The phase comparator 21 includes a delay circuit 31, an XOR (exclusive logical OR) circuit 32, and an XOR circuit 33. The delay circuit 31 generates M−1 (one in this example) reference signal Ref2 by delaying the reference signal Ref1 having the cycle of T. As illustrated in FIG. 2, the phase comparator 21 includes serially connected M (two in this example) two-input XOR circuits. The XOR circuit 32 at the first stage among the XOR circuits calculates an exclusive logical OR of any two signals among the two reference signals Ref1-Ref2 and the divided signal Div. In this example, an exclusive logical OR is calculated for the reference signal Ref1 and the divided signal Div. The XOR circuit 33 other than that of the first stage calculates an exclusive logical OR of any remaining one of the M reference signals and the divided signal, and the output of the XOR circuit 32 at the preceding stage. In this example, an exclusive logical OR is calculated for the reference signal Ref2 and the output Pout1 of the XOR circuit 32 at the preceding stage.

Note that the result of an exclusive logical OR calculation for M+1 inputs (M+1 bits) is 1 if the number of input bits having the value of 1 is an odd number, or 0 if it is an even number. This exclusive logical OR calculation can be calculated with an (M+1)-input XOR circuit, or can be implemented with M two-input XOR circuits that are serially connected. When configured as above, any one of the (M+1) input terminals can be applied with any one of the input signals without influencing the result of the exclusive logical OR calculation. Therefore, for example, two inputs of the XOR circuit 32 may be applied with the reference signals Ref1-Ref2, and two inputs of the XOR circuit 33 may be applied with the output of the XOR circuit 32 and the divided signal Div.

Figure 3:
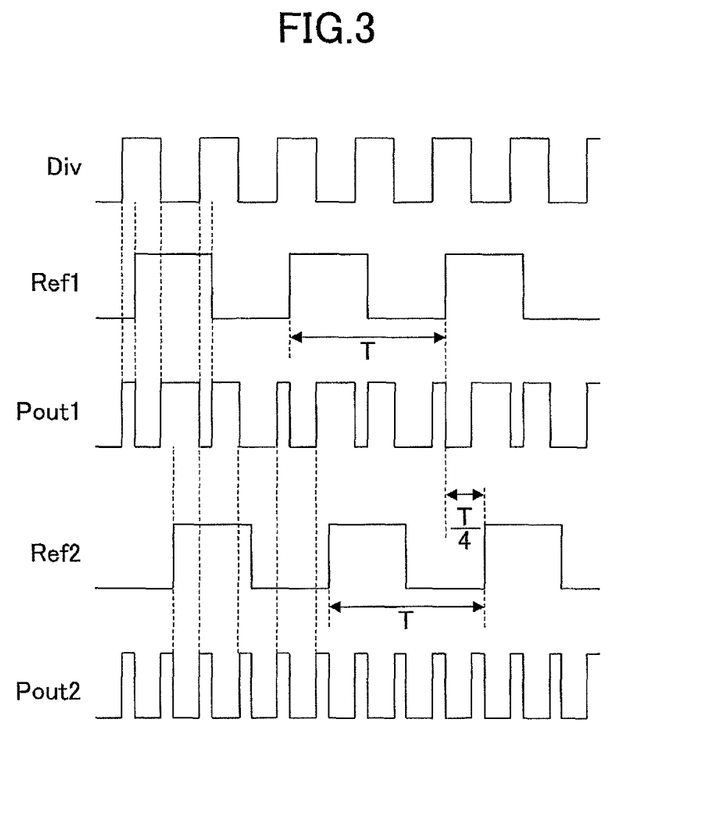
FIG. 3 is a timing chart illustrating a state of an exclusive logical OR calculation.

FIG. 3 is a timing chart illustrating a state of an exclusive logical OR calculation. By calculating an exclusive logical OR of the divided signal Div and the reference signal Ref1, the output signal Pout1 of the XOR circuit 32 is obtained. Further, by calculating an exclusive logical OR of the output signal Pout1 of the XOR circuit 32 and the reference signal Ref2, the output signal Pout2 of the XOR circuit 33 is obtained. As can be seen in FIG. 3, the M (two in this example) reference signals Ref1-Ref2 have the cycle of T and the respective time intervals shifted sequentially by T/2M (T/4 in this example). The output signal Pout2 as the phase comparison result is a signal that represents each phase difference between a rising edge or a falling edge of the divided signal Div and an edge of the corresponding reference signal Ref1 or Ref2. Namely, the magnitude of a phase difference corresponds to the pulse width of each pulse of the output signal Pout2.

Note that the exclusive logical OR calculation illustrated in FIG. 3 is equivalent to calculating an exclusive logical OR of the reference signals Ref1-Ref2, and then calculating an exclusive logical OR of the result of the above exclusive logical OR and the divided signal Div. By calculating an exclusive logical OR of the reference signals Ref1-Ref2, a reference signal is generated that has a cycle equivalent to the cycle (T/2) of the divided signal Div, a phase that corresponds to the phase of the reference signals Ref1-Ref2, and a frequency that is twice greater. And the phase comparison result is obtained by applying an exclusive logical OR calculation to the reference signal (cycle T/2) having a frequency twice greater and the divided signal Div (cycle T/2).

In the PLL circuit described above, the cycles of the reference signal Ref1 and the divided signal Div have a ratio of 1:1/M. Namely, compared to a usual PLL circuit that has the same cycle T for the reference signal and the divided signal, the PLL circuit in FIG. 2 has a relatively smaller cycle for the divided signal Div (the frequency is relatively greater). Namely, compared to a usual PLL circuit, the division ratio N is smaller in the divider 24 illustrated in FIG. 2.

The output signal of a phase comparator includes phase noise generated by the phase comparator, and phase noise induced by the above phase noise that appears in the output oscillation signal of the PLL circuit is proportionate to the square of the division ratio N as represented in the above formula (1). Therefore, by making the division ratio N smaller, the phase noise appearing in the output oscillation signal of the PLL circuit can be reduced. This will be described in detail below. In the PLL circuit illustrated in FIG. 2, the division ratio of the divider 24 can be reduced to 1/M by placing multiple M (two in this example) phase comparators. Suppose that a division ratio of the divider 24 is reduced to N0/M as above. In general, feedback gain is 1/N that is obtained with a divider having the division rate N. Therefore, if the division ratio is N0/M, the feedback gain is M/N0, which is M times greater than the gain 1/N0 before reducing the division ratio. If the feedback gain is M times, the amount of feedback is amplified M times greater, and contribution to noise added after the feedback can be restricted to 1/M. Namely, contribution of the phase comparator noise to the PLL phase noise becomes 1/M times smaller.

Note that thermal noise, shot noise, and flicker noise that are generated by a transistor at the final stage of output are dominant in the phase noise generated by a phase comparator. Therefore, the phase noise generated by a phase comparator hardly changes if XOR circuits are serially connected in multiple stages as in the circuit configuration in FIG. 2, compared to a single stage XOR circuit. Therefore, phase noise reduction effect of the circuit configuration in FIG. 2 is notably significant.

Figure 4:
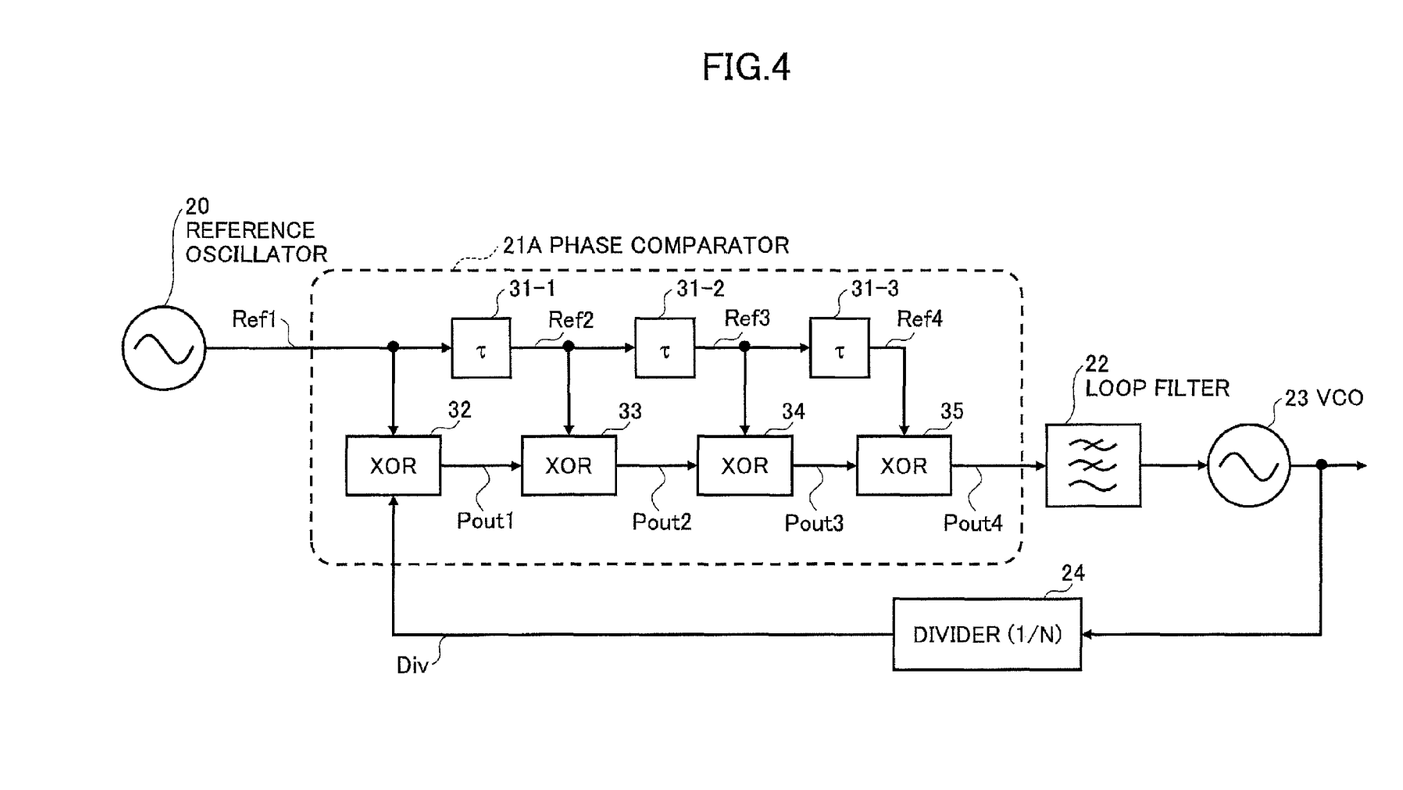
FIG. 4 is a schematic view illustrating another example of a configuration of a PLL circuit according to an embodiment.

FIG. 4 is a schematic view illustrating another example of a configuration of a PLL circuit according to an embodiment. In FIG. 4, the same or corresponding elements as in FIG. 2 are referred to with the same or corresponding numerical codes, and their description is omitted accordingly. A PLL circuit illustrated in FIG. 4 includes a reference oscillator 20, a phase comparator 21A, a loop filter 22, a VCO 23, and a divider 24.

The divider 24 divides the oscillation signal from the VCO 23 to generate the divided signal Div having the cycle of T/M. Here, M is an integer greater than or equal to two, which is four in this example. Also, T is the cycle of the reference signal Ref1 that is oscillated by the reference oscillator 20. The phase comparator 21A calculates an exclusive logical OR of the reference signals Ref1-Ref4 and the divided signal Div to generate a phase comparison result Pout4 where the M (four in this example) reference signals Ref1-Ref4 have the cycle T and respective time intervals shifted sequentially by T/2M (T/8 in this example).

The phase comparator 21A includes delay circuits 31-1 to 31-3, and XOR circuits 32 to 35. The delay circuits 31-1 to 31-3 generate M−1 (three in this example) reference signals Ref2 to Ref4 by delaying the reference signal Ref1 having the cycle of T with different delay times, respectively. As illustrated in FIG. 4, the phase comparator 21A includes serially connected M (four in this example) two-input XOR circuits. The XOR circuit 32 at the first stage among the XOR circuits calculates an exclusive logical OR of any two signals among the four reference signals Ref1-Ref4 and the divided signal Div. In this example, an exclusive logical OR is calculated for the reference signal Ref1 and the divided signal Div. Each of the XOR circuits 33 to 35 other than that of the first stage calculates an exclusive logical OR of any remaining one of the M reference signals and the divided signal, and the output of the XOR circuit at the preceding stage. In this example, an exclusive logical OR is calculated for one of the reference signals and the output of the XOR circuit at the preceding stage.

Note that the result of an exclusive logical OR calculation for M+1 inputs (M+1 bits) is 1 if the number of input bits having the value of 1 is an odd number, or 0 if it is an even number. This exclusive logical OR calculation can be calculated with an (M+1)-input XOR circuit, or can be implemented with M two-input XOR circuits that are serially connected. When configured as above, any one of the M+1 input terminals can be applied with any one of the input signals without influencing the result of the exclusive logical OR calculation. Therefore, for example, two inputs of the XOR circuit 32 may be applied with the reference signals Ref1-Ref2. In this case, two inputs of the XOR circuits 33 and 34 may be applied with the reference signals Ref3-Ref4 and the outputs of the XOR circuits at the preceding stages, respectively, and two inputs of the XOR circuit 35 may be applied with the output of the XOR circuit 34 and the divided signal Div.

Figure 5:
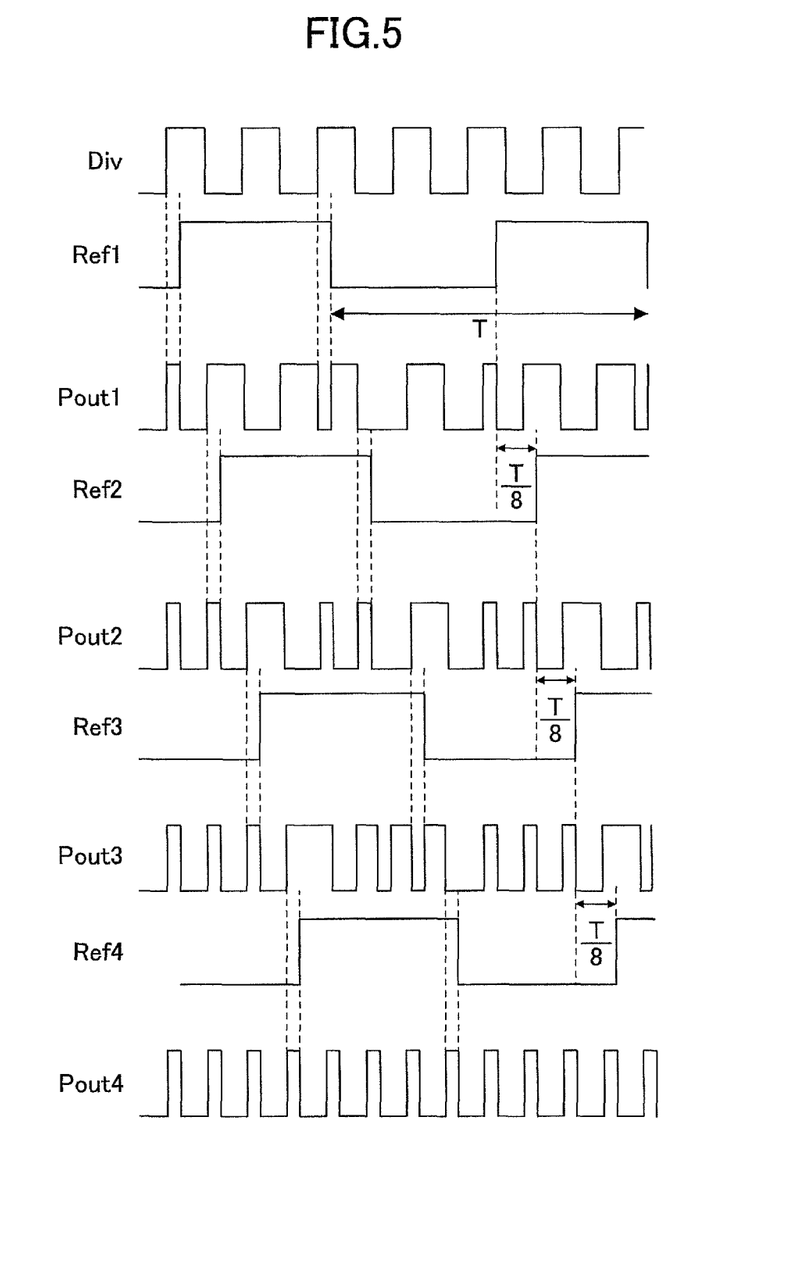
FIG. 5 is a timing chart illustrating a state of an exclusive logical OR calculation.

FIG. 5 is a timing chart illustrating a state of an exclusive logical OR calculation. By calculating an exclusive logical OR of the divided signal Div and the reference signal Ref1, the output signal Pout1 of the XOR circuit 32 is obtained. Further, by calculating an exclusive logical OR of the output signal Pout1 of the XOR circuit 32 and the reference signal Ref2, the output signal Pout2 of the XOR circuit 33 is obtained. Further, by calculating an exclusive logical OR of the output signal Pout2 of the XOR circuit 33 and the reference signal Ref3, the output signal Pout3 of the XOR circuit 34 is obtained. Finally, by calculating an exclusive logical OR of the output signal Pout3 of the XOR circuit 34 and the reference signal Ref4, the output signal Pout4 of the XOR circuit 35 is obtained. As can be seen in FIG. 5, M (four in this example) reference signals Ref1-Ref4 have the cycle of T and the respective time intervals shifted sequentially by T/2M (T/8 in this example). The output signal Pout4 as the phase comparison result is a signal that represents each phase difference between a rising edge or a falling edge of the divided signal Div and an edge of the corresponding one of the reference signals. Namely, the magnitude of a phase difference corresponds to the pulse width of each pulse of the output signal Pout4.

Note that the exclusive logical OR calculation illustrated in FIG. 5 is equivalent to calculating an exclusive logical OR of the reference signals Ref1-Ref4, and then calculating an exclusive logical OR of the result of the above exclusive logical OR and the divided signal Div. By calculating an exclusive logical OR of the reference signals Ref1-Ref4, a reference signal is generated that has a cycle equivalent to the cycle (T/4) of the divided signal Div, a phase that corresponds to the phase of the reference signals Ref1-Ref4, and a frequency that is four times greater. And the phase comparison result is obtained by applying an exclusive logical OR calculation to the reference signal (cycle T/4) having a frequency four times greater and the divided signal Div (cycle T/4).

Figure 6:
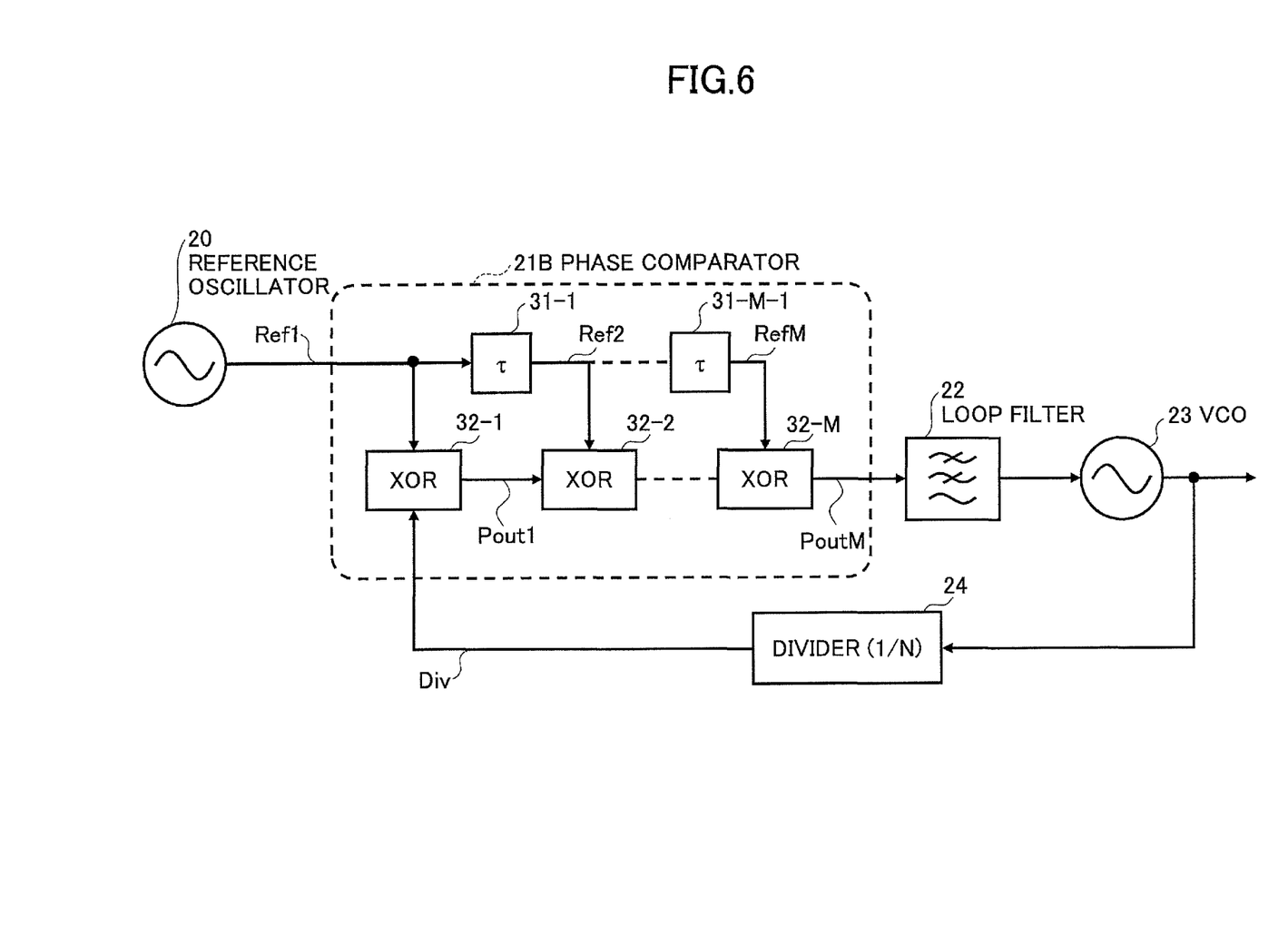
FIG. 6 is a schematic view illustrating an example of a general configuration of a PLL circuit according to an embodiment.

FIG. 6 is a schematic view illustrating an example of a general configuration of a PLL circuit according to an embodiment. In FIG. 6, the same or corresponding elements as in FIG. 2 are referred to with the same or corresponding numerical codes, and their description is omitted accordingly. A PLL circuit illustrated in FIG. 6 includes a reference oscillator 20, a phase comparator 21B, a loop filter 22, a VCO 23, and a divider 24.

The divider 24 divides the oscillation signal from the VCO 23 to generate the divided signal Div having the cycle of T/M. Here, M is an integer greater than or equal to two. Also, T is the cycle of the reference signal Ref1 that is oscillated by the reference oscillator 20. The phase comparator 21B calculates an exclusive logical OR of the reference signals Ref1-RefM and the divided signal Div to generate a phase comparison result PoutM where the M reference signals Ref1-Ref2 have the cycle T and respective time intervals shifted sequentially by T/2M.

The phase comparator 21B includes delay circuits 31-1 to 31-M-1, and XOR circuits 32-1 to 32-M. The delay circuits 31-1 to 31-M-1 generate M–1 reference signals Ref2 to RefM by delaying the reference signal Ref1 having the cycle of T with different delay times, respectively. As illustrated in FIG. 6, the phase comparator 21B includes serially connected M two-input XOR circuits. The XOR circuit 32-1 at the first stage among the XOR circuits calculates an exclusive logical OR of any two signals among the M reference signals Ref1-RefM and the divided signal Div. In this example, an exclusive logical OR is calculated for the reference signal Ref1 and the divided signal Div. Each of the XOR circuits 32-2 to 32-M other than that of the first stage calculates an exclusive logical OR of any remaining one of the M reference signals and the divided signal, and the output of the XOR circuit at the preceding stage. In this example, an exclusive logical OR is calculated for each one of the reference signals and the output of the XOR circuit at the preceding stage.

Figure 7:
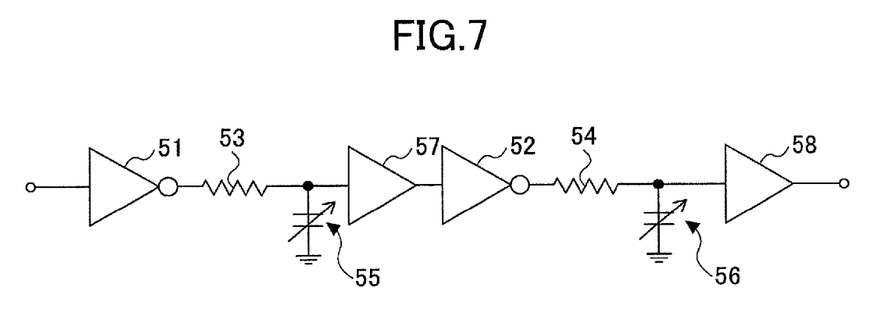
FIG. 7 is a schematic view illustrating an example of a configuration of a delay circuit.

FIG. 7 is a schematic view illustrating an example of a configuration of a delay circuit. The delay circuit illustrated in FIG. 7 may be used in the phase comparators illustrated in FIG. 2, FIG. 4, and FIG. 6. The delay circuit illustrated in FIG. 7 includes inverters 51-52, resistor elements 53-54, capacitance elements 55-56, and buffers 57-58. The inverter 51 generates an output signal at its output terminal that logically inverts an input signal. Depending of the voltage of the output signal, a current flows via the resistor element 53 and the capacitance element 55, and the capacitance element 55 is charged or discharged. The charge or discharge operation of the capacitance element 55 changes the input signal voltage of the inverter 52 via the buffer 57, and if it exceeds a threshold voltage of the inverter 52, the output signal voltage of the inverter 52 changes. The capacitance element 56 is similarly charged or discharged by the change of the output signal voltage of the inverter 52. Speed of change of the voltage between terminals of the capacitance element is determined depending on the resistor value R of the resistor element and the capacitance value C of the capacitance element. Depending on the speed of change of the voltage between terminals of the capacitance element, a delay time is determined for the signal to propagate from the input terminal of the delay circuit to the output terminal.

Characteristics of the inverters 51-52 may be equivalent to each other, the resistor values of the resistor elements 53-54 may be the same, the capacitance values of the capacitance elements 55-56 may be the same, and characteristics of the buffers 57-58 may be equivalent to each other. This makes it possible to delay an edge of the inverted signal output from the inverter 51, and an edge of the non-inverted signal output from the inverter 52 by the same delay amount, with respect to an input reference signal, based on substantially the same delay mechanism. Therefore, a rising edge and a falling edge of the input reference signal are delayed by the same delay amount based on substantially the same delay mechanism. To appropriately perform phase comparison in a phase comparator, the duty of a reference signal needs to be maintained at the same value before and after a delay. With the circuit configuration illustrated in FIG. 7, the duty of the reference signal can be maintained at the same value before and after the delay, by using a delay element (inverter) with which the output logic is inverted from the input logic.

In addition, the reference signal needs to be correctly delayed by a desired delay time such as T/4 in FIG. 3 or T/8 in FIG. 5. To achieve this, it is desirable that the delay time is adjustable. In the configuration of the delay circuit illustrated in FIG. 7, variable capacitance elements (varactors) are used for the capacitance elements 55-56. By changing a varactor control voltage applied to the control terminals of the variable capacitance elements 55-56, the capacitance values of the variable capacitance elements 55-56 can be changed. This enables it to realize a desired delay time.

Note that, as can be seen from FIG. 3 and FIG. 5, the delay amount for delaying the reference signal is smaller than half of the cycle T of the reference signal at maximum. Compared to the conventional technology described above in which multiple M phase comparators are arrayed to use M reference signals having phases shifted sequentially by T/M, the length of the delay time for delaying the reference signal can be halved with the PLL circuit disclosed in the present invention. Therefore, the circuit area of the delay circuit can be halved for the PLL circuit disclosed in the present invention. Moreover, a SUM circuit used in the conventional technology does not need to be equipped because only an exclusive logical OR needs to be calculated by XOR circuits.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A PLL circuit comprising:
   a divider configured to generate a divided signal having a cycle of T/M (where M is an integer greater than or equal to two) by dividing an oscillation signal;
   a phase comparator configured to generate a phase comparison result by calculating an exclusive logical OR of M reference signals and the divided signal, the M reference signals having the cycle of T and respective time intervals shifted sequentially by T/2M;
   a loop filter configured to generate a voltage signal using the phase comparison result as input; and
   a voltage-controlled oscillator configured to generate the oscillation signal by oscillating at a frequency depending on the voltage signal.
2. The PLL circuit as claimed in claim 1, wherein the phase comparator includes serially connected M two-input XOR circuits, one of the XOR circuits at a first stage calculates an exclusive logical OR of any two of the M reference signals and the divided signal, and each of the XOR circuits other than the XOR circuit at the first stage calculates an exclusive logical OR of one of the M reference signals and the divided signal, and an output of one of the XOR circuits at a preceding stage.
3. The PLL circuit as claimed in claim 1, wherein the phase comparator includes a delay circuit configured to generate M-1 reference signals by delaying a reference signal having the cycle of T by different delay times, respectively.
4. The PLL circuit as claimed in claim 3, wherein a delay amount of the delay circuit is variable.
5. The PLL circuit as claimed in claim 4, wherein the delay circuit includes a delay element in which an output logic is inverted from an input logic.

* * * * *